United States Patent [19]

Pitzalis, Jr.

[11] 4,371,845
[45] Feb. 1, 1983

[54] MODULAR MICROWAVE POWER DIVIDER-AMPLIFIER-COMBINER

[75] Inventor: Octavius Pitzalis, Jr., Pacific Palisades, Calif.

[73] Assignee: Hughes Aircraft Company, Culver City, Calif.

[21] Appl. No.: 274,004

[22] Filed: Jun. 15, 1981

Related U.S. Application Data

[63] Continuation-in-part of Ser. No. 152,470, May 23, 1980, abandoned.

[51] Int. Cl.³ .......................... H03F 3/16; H01P 5/12
[52] U.S. Cl. .................................. 330/277; 330/286; 333/127; 333/128; 333/238
[58] Field of Search ............... 333/1, 127, 128, 33, 333/35, 238, 246; 330/56, 277, 286, 287

[56] References Cited

U.S. PATENT DOCUMENTS

| | | | |
|---|---|---|---|
| 2,721,312 | 10/1955 | Grieg et al. | 333/238 |
| 3,320,556 | 5/1967 | Schneider | 333/238 X |
| 3,582,813 | 6/1971 | Hines | 330/287 X |
| 4,234,854 | 11/1980 | Schellenberg et al. | 330/286 |

OTHER PUBLICATIONS

*Compact Radial Power Combiner Teams Up a Dozen Power GaAs FET's*, Microwaves, Oct. 1977, p. 9.
*Transition Combinational Techniques*, Tech. Report AFAL-TR-77-205, Westinghouse Elec. Corp., Nov. 1977.

*Primary Examiner*—Paul L. Gensler
*Attorney, Agent, or Firm*—G. B. Rosenberg; W. H. MacAllister; A. W. Karambelas

[57] ABSTRACT

A power divider/combiner assembly is provided which matches the impedance seen at the input/output port with the impedance seen at the peripheral end of each of plural radial transmission lines. Impedance matching is accomplished through the use of an inverted microstrip on a substrate suspended over an air dielectric. The thickness of the air dielectric is varied along each transmission line in discrete steps from the common dividing/combining end to the peripheral end of each transmission line. The air dielectric thickness can be chosen independently for each section of line so that a characteristic impedance of from 40 ohms to greater than 130 ohms is achieved.

25 Claims, 5 Drawing Figures

MODULAR MICROWAVE POWER DIVIDER-AMPLIFIER-COMBINER

CROSS-REFERENCE RELATED APPLICATION

This is a continuation-in-part of application Ser. No. 152,470, filed May 23, 1980, now abandoned.

TECHNICAL FIELD

This invention relates to the art of microwave power sources, and more particularly to devices for amplifying microwave power. These devices typically divide input power to be fed to plural modular amplifier units and combine the outputs of the amplifier units into an amplified output.

BACKGROUND OF THE INVENTION

1. Field of the Invention

There are two basic ways to achieve higher microwave power levels: device combining and circuit combining. Device combining is normally achieved by paralleling plural device units, thereby creating in effect a larger device with higher power output. This invention takes the circuit combining approach wherein a flow of microwave power is divided among the inputs to plural amplifier circuits whose outputs are combined to yield a flow of greater power. The invention is an improvement in the part of a device that divides or combines power, known as a power divider/combiner.

2. Description of the Prior Art

Power amplification with broad bandwidth at microwave frequencies was the exclusive domain of traveling wave tubes until the relatively recent advent of solid-state devices that can provide reasonable gain and power output above 6 GHz. The development of relatively efficient solid-state power combining schemes has made possible medium-power solid-state sources with performance comparable to or exceeding that of traveling wave tubes. These solid-state sources have incorporated developments in the field of field-effect transistors (FETs), resulting in improved efficiency and linearity along with greater reliability and lower size, weight and system cost. Furthermore, power supply requirements have been simplified because transistors require low voltages as compared to traveling-wave-tube high voltage supplies, with their accompanying insulation and reliability problems.

A recent approach in the development of modular FET power divider-amplifier-combiner systems, taught in U.S. Pat. No. 4,234,854, has been the use of radial microstrip line divider/combiners. In this approach, power is divided and fed to a first set of radial microstrip transmission lines, with each line feeding a separate elemental amplifier unit. The output of each amplifier unit feeds one of a second set of radial microstrip transmission lines. The second set of radial transmission lines conducts power to a point where the power is combined and conducted from the system.

Radial power divider-amplifier-combiner systems of the type described above present difficult impedance matching problems. The usable bandwidth of such systems that use FETs as amplifiers is principally determined by the control of the load impedance with frequency as seen by the output of each elemental FET amplifier unit. This load impedance directly affects the gain and saturated output power of the unit. Therefore, an effective system should provide a voltage standing wave ratio (VSWR) of 1.25:1 or less to the output of the FET amplifier units over the full operating bandwidth. One approach to impedance matching, taught in U.S. Pat. No. 3,582,813, has been to use transmission lines that taper in width from the outer circumference of the set of radial lines to the center dividing/combining point. The impedance transforming in the radial microstrip transmission lines requires high characteristic impedance sections to achieve the broadest bandwidth performance. However, the wide tapered microstrip transmission lines have a low characteristic impedance, which sacrifices potential bandwidth. High characteristic impedance lines (greater than or equal to 80 ohms) are extremely narrow width lines that are impractical to define, and also have large dissipative loss when compared with low characteristic impedance transmission lines of 50 ohms or less. A sufficiently high characteristic impedance and low power loss required in many applications cannot be realized simultaneously using conventional divider-amplifier-combiner designs.

SUMMARY OF THE INVENTION

In accordance with the invention, a power divider/combiner is provided. The power divider/combiner comprises:

(a) a power input/output port;

(b) a microwave power energy radial divider/combiner section comprising plural microwave energy transmission lines symmetrically radiating from the common input/output port to the outer edge of the divider/combiner section, each microstrip transmission line comprising a microstrip conductor extending from the common input/output port to the outer edge of the divider/combiner section; and (c) means for transmitting microwave energy between the input/output port and the divider/combiner section.

The power divider/combiner of the invention is characterized by an electrically conductive base surface, facing and fixably separated from the microstrip conductor, thereby forming a space between the microstrip conductor and the base surface. The space is filled with a dielectric medium, and the distance of separation between the microstrip conductor and the base surface varies along the length of the transmission line such that an increasing impedance is attained from the outer edge to the common input/output port. Additional impedance increasing quarter wavelength long segments are effectively paralleled in the coaxial line of the input/output port so that the impedance values of the impedance matching segments can be optimally selected, thereby improving bandwidth and decreasing VSWR.

The present invention solves the inherent trade-off problems of the prior art by introducing a new and different design variable into the system design. The divider element and the combiner element both use inverted radial microstrip transmission lines suspended over a dielectric medium of variable thickness. The characteristic impedance of the microstrip lines is thereby independently variable to provide proper impedance matching, by adjusting the dielectric thickness and the width of the line. In conventional microstrip, only the width of the lines is varied to change the characteristic impedance. The added variable of dielectric thickness permits the realization of a wide range of characteristic impedances using relatively broad line widths that are of low loss and are easily reproducible. The divider/combiner element also utilizes impedance matching transformer sections in the common input-/output port line as well as in the radial microstrip lines. The common input/output port transformer sections provide a means for effectively obtaining large characteristic impedance values that are not otherwise practically realizable in the inverted radial microstrip lines without significant bandwidth loss. Thus, bandwidth optimal section impedances can be selected for the radial transmission and common input/output lines according to their respective capabilities.

A microwave power divider or combiner element according to the present invention comprises a power input/output port at the center of the device, plural microwave energy transmission lines, with each line comprising a dielectric-filled "channel" through which microwave energy may propagate, each channel having a thickness that progressively becomes narrower in plural discrete steps from one end of the transmission line to the other and means for optimally establishing the characteristic impedance of the transmission lines, either prior to or subsequently to, respectively, equally dividing or combining the power present at the input-/output port at the ends of the transmission lines where the dielectric-filled channels are widest. Such a device can be used as either the divider element or the combiner element of a power-divider-amplifier-combiner system, depending on which way power is caused to flow.

Accordingly, the present invention advantageously provides optimal impedance matching in a power divider-amplifier-combiner without introducing excessive power losses therein.

Also advantageously, a new and improved power divider-amplifier-combiner system of the type described is provided.

These and other advantages and features of this invention will become more apparent from the following description of a preferred embodiment of the invention.

DETAILED DESCRIPTION OF THE INVENTION

Figure 1:
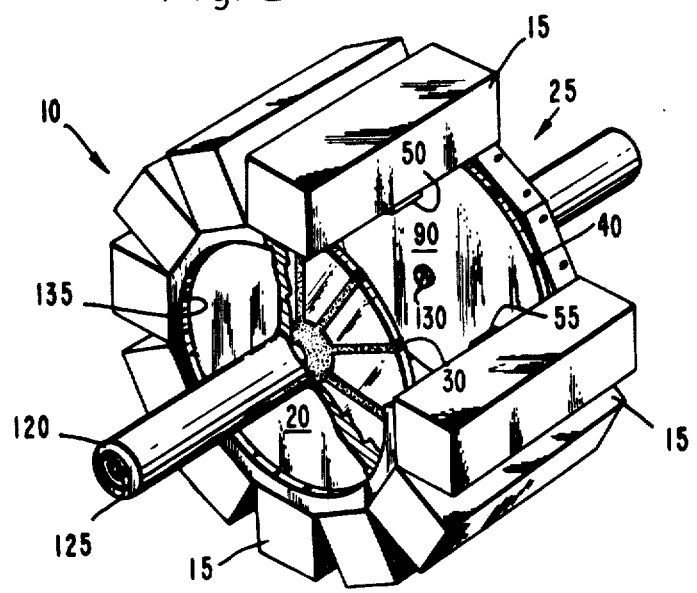
FIG. 1 is a perspective view illustrating a microwave power divider-amplifier-combiner device according to this invention.
Figure 2:
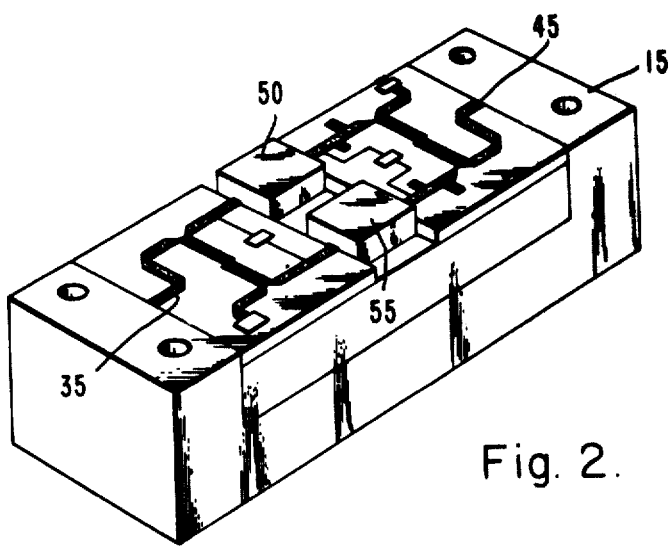
FIG. 2 is a perspective view of one amplifier module.

In FIG. 1, a modular microwave power divider-amplifier-combiner 10 is shown with two amplifier modules 15 shown removed for greater detail. The power divider-amplifier-combiner comprises a divider 20, plural amplifier modules 15 and a combiner 25. In a preferred embodiment of the invention, twelve amplifier modules 15 are employed, although the invention could be used with other quantities of amplifier modules 15. The divider 20 and the combiner 25 are electrically independent of each other, and can be physically connected by only the amplifier modules 15. A plurality of radially-extending microstrip conductors of the divider 20 (described in detail later) extend to the edge of the divider circuit substrate at point 30, and come into intimate contact with conductor 35 of amplifier module 15. Likewise, plural radially-extending microstrip conductors of the combiner extend to the edge of the combiner at point 40, and come into intimate contact with conductor 45 of amplifier module 15. Each of the amplifier modules 15 is connected to the divider 20 and the combiner 25 in a similar manner. One of the amplifier modules is shown in greater detail in FIG. 2. Each amplifier module 15 contains a pair of field-effect transistors 50 and 55 that are hybrid-combined, as is known in this art. Of course, other types of amplifier circuits can be used; the hybrid-combined pair of FETs are shown as examples only.

The divider 20 and the combiner 25 are exactly identical devices, differentiated only because they perform different functions when in operation. Therefore, each device may be referred to as a "divider/combiner".

Figure 3:
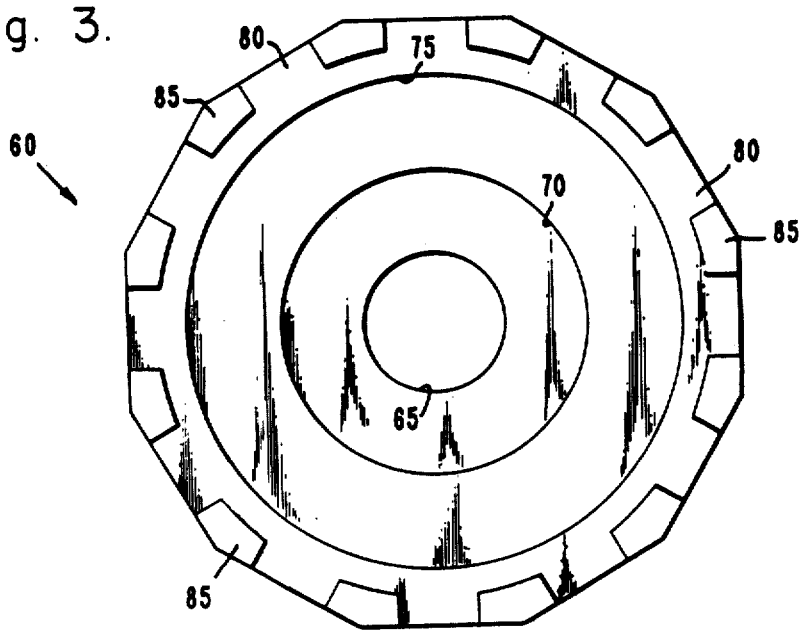
FIG. 3 is a top view of a divider/combiner base element alone according to the present invention.

FIG. 3 shows the base element of a divider/combiner. This view is directed toward the end of the base element that interfaces with the radially-extending microstrip conductors. The features of FIG. 3 may be seen in section in FIG. 5.

The divider 20 and the combiner 25 each comprise a solid base element 60, typically made of copper or another electrically conductive material. The base element 60 has a cylindrical hole 65 along its axis, and the outer periphery of the base element defines a plurality of flat surfaces to accommodate the respective amplifier modules 15.

The broad end surface of the base element 60 is defined by three concentric circular annular planes 70, 75 and 80. Each of these annular planes is parallel to the others. The outer annulus 80 is further defined by a plurality of small spacers 85 in each of the corners. These spacers 85 may be an integral part of the base element 60, or they may be separate parts that are joined to the surface of annular plane 80.

Figure 4:
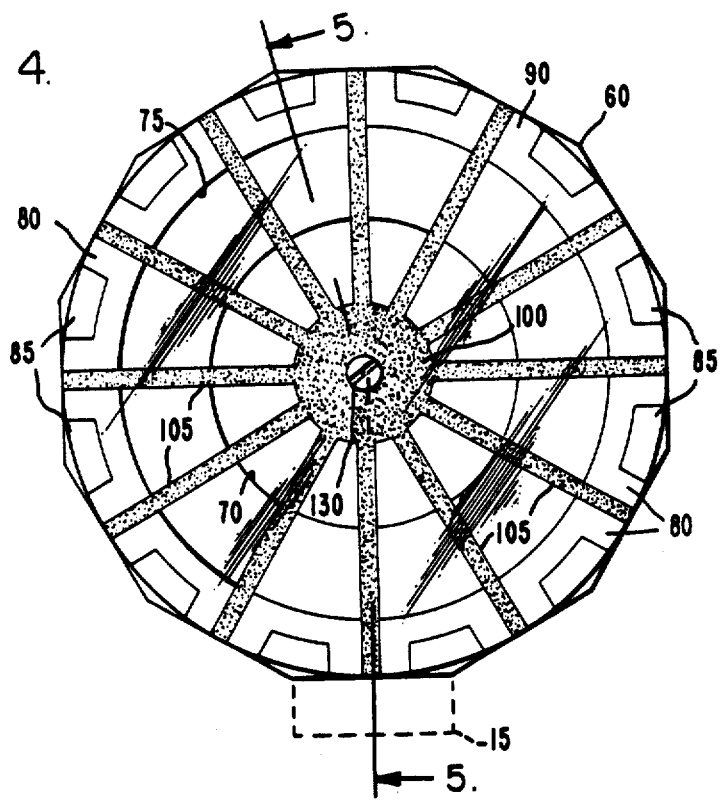
FIG. 4 is a top view of the whole divider/combiner device according to the present invention.

FIG. 4 shows the same view of the broad end of base element 60, but with the addition of other components of the divider-amplifier-combiner system. A substrate 90 is disposed adjacent the broad end of base element 60. The substrate 90 is fixably separated from annular planes 70, 75 and 80 by the plural spacers 85. Substrate 90 may be made of transparent quartz, and can be shaped like a flat circular disk with a circular hole 95 (seen in FIG. 5) in the center for accepting screw 130. The center of the substrate 90 is aligned with the axis of the base element 60.

A pattern of microstrip conductors is deposited on one side of substrate 90. The microstrip conductor pattern may be etched chrome-gold stripes. The microstrip conductor pattern comprises a microstrip annulus 100 encircling the center hole 95 in substrate 90, and a plurality of radial microstrip lines 105. The plural microstrip lines 105 radiate from the microstrip annulus 100 to the periphery of substrate 90 and over the peripheral edge, as seen from points 30 and 40 of FIG. 1. The microstrip pattern 100 and 105 is disposed on the side of substrate 90 that faces base element 60. Therefore, the microstrip pattern 100 and 105 is separated from annular planes 70, 75 and 80 by only a thin space 110 and the plural spacers 85 (as seen in FIG. 4). One amplifier module 15 is shown attached to one of the flat peripheral sides of the base element 60 in FIG. 4.

Figure 5:
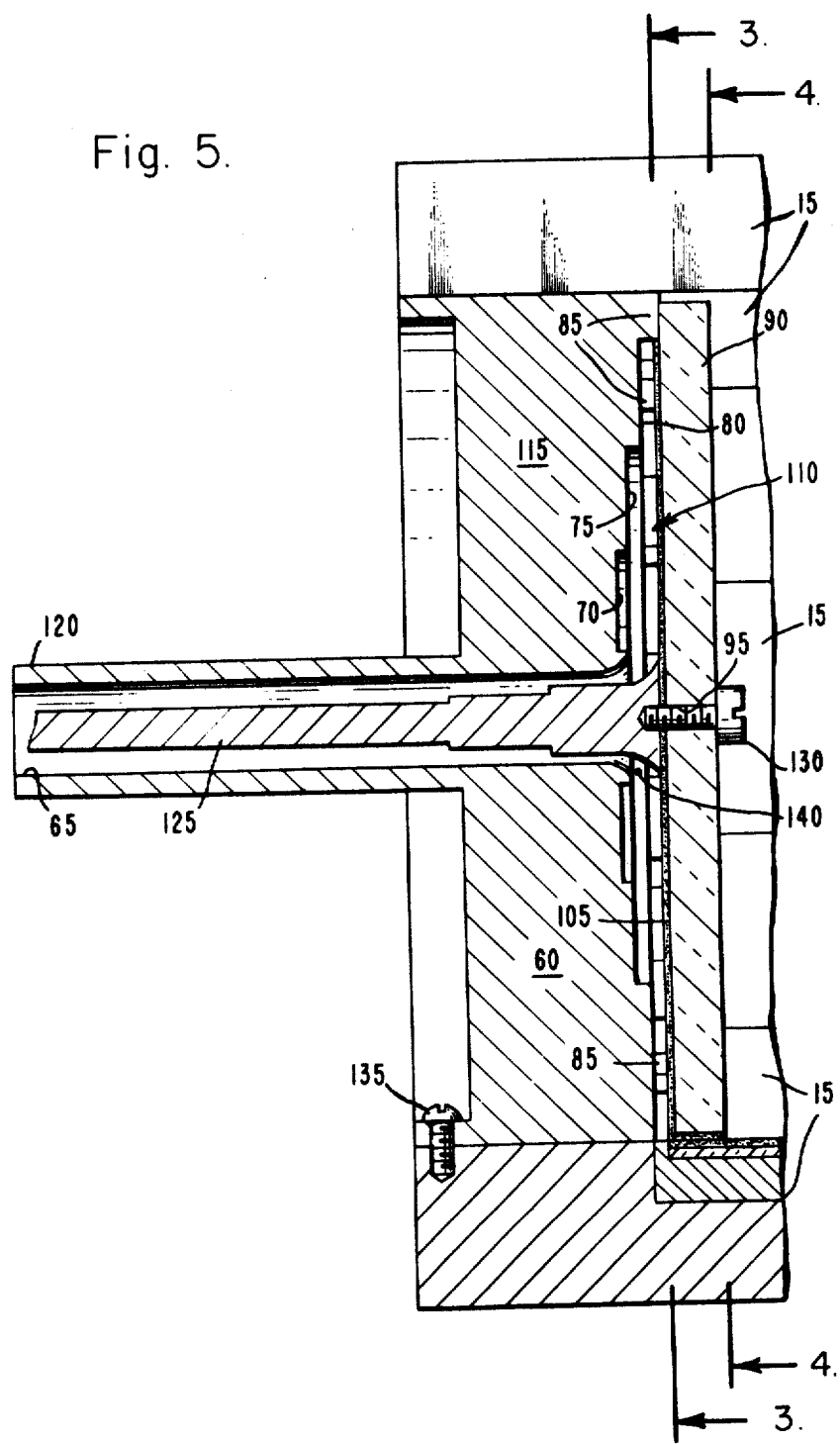
FIG. 5 is a sectional view taken along section line 5—5 of FIG. 4.

In FIG. 5, the base element 60 of the divider/combiner comprises a solid base body portion 115 and a coaxial transmission line with tubular portion 120 projecting beyond the body portion. The axis of the tubular portion 120 is aligned with the axis of the hole in the base body portion 115 and with the center of substrate 90.

A cylindrical rod 125 functioning as the center conductor of the coaxial transmission line is joined to the substrate 90 by screw 130, and electrically contacts the microwave annulus 100. The rod 125 can be made of an electrically conductive material, such as copper, and its diameter tapers in discrete steps along its length. Rod 125 has a gradual taper near the end joined to substrate 90. The axis of the rod 125 is aligned with the axis of base element tube portion 120. The tubular portion 120 and rod 125 function as a coaxial transmission line power input/output port. One of the modular amplifiers 15 is shown attached to the base element 60 by screw 135.

A combiner for N (here, 12) separate signal sources to be combined in phase with one another makes use of individual transmission lines from the N-ports which are joined in a parallel electrical connection at the common port. In general, the impedance at the common and the N-subsidiary ports is a specified value, typically 50 ohms. In view of the N transmission lines electrically connected in parallel at the common port, each line must have an input impedance N times greater, or 50N ohms. To accomplish this, each of the transmission lines from the N-ports must include an N:1 impedance transformation. For small values of N (e.g., N≦4) and/or where a low VSWR is not required over too broad a bandwidth, a single quarter wavelength transmission line transformer matching section might be included in each line. As is known in the art, the characteristic impedance of the quarter wavelength transmission line section is chosen to be $N^{\frac{1}{2}}$ times the nominal port impedance, or $Z_o = 50 \times N^{\frac{1}{2}}$ in the case of 50 ohm port impedances. For N=4 with 50 ohm port impedances, a $Z_o = 100$ ohm quarter wavelength section of transmission line would be used for matching. The VSWR over a 20 percent bandwidth would be within 1.26:1. In the case of N=12, then a $Z_o = 173$ ohm section would be used and the VSWR over a 20 percent bandwidth would be much poorer at 1.64:1.

Impedance transforming with multi-section quarter wavelength transmission line transformers is employed herein in the combiner of the invention to achieve low VSWR values over much broader bandwidths.

A four section design was taken from standardized design tables (Matthaei, Young and Jones, "Impedance Matching Networks and Coupling Structures", McGraw-Hill, New York, NY (1964), pp. 267-285). For nominal terminal port impedances of 50 ohms at each of the microstrip lines 105 and the common input/output port, the characteristic impedance of the four quarter wavelength sections ascend in approaching the ends of the microstrip lines 105 to be joined at the common port. These respective optimal impedances are 61.5, 113.5, 264 and 488 ohms. This design gives Chebyshev equal ripple VSWR response within 1.02:1 over a 60 percent bandwidth. In the divider/combiner of the invention, sections are chosen to be one quarter wavelength long at an operating frequency of 10 GHz, with the corresponding 60 percent bandwidth extending between 7 and 13 GHz. To construct these sections, high $Z_o$ lines of preferred line widths are achieved through the use of inverted microstrip on a quartz substrate suspended over an air dielectric. The thicknesses of the air dielectric can be chosen independently for each section of line so that a $Z_o$ of from 40 ohms to greater than 130 ohms is obtained using 1.52 mm (0.060 inch) wide lines by varying the air dielectric thickness from about 0.006 to 0.1 inch. With a narrower, 0.025 inch line width a $Z_o$ of 170 ohms is realizable for a 0.1 inch dielectric thickness. Thus, the 61.5 and 113.5 ohm sections can be provided as radial quarter wavelength microstrip sections, corresponding to the respective annular planes 75 and 70 (the annular plane 80 corresponds to the 50 ohm terminal port section of the microstrip transmission line). However, the 264 ohm and 488 ohm transmission line sections cannot be practically realized in inverted microstrip. These two sections can be paralleled for all N=12 transmission lines and constructed as transformer sections in the common input/output port line 125 with characteristic impedances $264/12 = 22.0$ ohms and $488/12 = 40.7$ (the 1/12 factor due to the effective paralleling of the N=12 microstrip transmission lines 105) ohms. This modification does not change the port impedance characteristics with frequency of the combiner design. Consequently, the two radial matching sections with $Z_o = 113.5$ ohms and $Z_o = 61.5$ ohms are readily constructed as suspended microstrip lines of deposited gold metallization 0.060 inch wide on a 0.060 inch thick circular quartz substrate. The 113.5 ohm line is more difficult to construct in conventional microstrip form than in the suspended microstrip. The line width must be made much narrower, with higher electrical losses. The characteristic impedance value of a narrower line is more sensitive to line width tolerances than a wider line would be. In conventional microstrip form, the 0.060 inch wide lines on the 0.060 inch thick quartz would have a characteristic impedance of only 77 ohms. The remaining two transmission line matching sections, having optimally selected impedances that are too high to be practically and efficiently implemented in microstrip transmission lines, are provided as quarter wavelength transformer sections in the common input/output port line 125. As described above, their impedances are appropriately selected as 1/N of the impedance of their respective optimal impedance transmission line sections. Therefore, a major advantage of the divider/combiner of the invention over the previous devices of the prior art is the improved ability to achieve the high characteristic impedance necessary in the impedance transformers. The impedance matching transformers could be realized in other forms than the quarter wave series sections demonstrated above. For example, linearly or exponentially tapered radial or coaxial line transformers could be used. In all cases for broad bandwidth impedance matching, the need would exist for equivalent values of high characteristic impedances in the transmission lines.

In operation, when the divider/combiner is used as a power divider, microwave power from a power source (not shown) is transmitted through the tubular cavity between the base element coaxial transmission line consisting of the tubular portion 120 and the rod 125. The input power divides into a plurality of power segments in region 140 around the rod 125. The number of power segments equals the number of radial microstrip lines 105. Each radial line 105 conducts a power segment to point 30 (in FIG. 1), where that power segment feeds an amplifier module 15. Each amplifier module amplifies the power segment and conducts the amplified power segment to point 40 (in FIG. 1) of the combiner.

When the divider/combiner operates as a power combiner, power conducted to each of the radial microstrip lines 105 is transmitted to region 140. All of the amplified power segments combine in this region to form one stream of amplified microwave power. This stream of power is then transmitted through the coaxial transmission line consisting of the tubular portion 120 and rod 125, and out of the system.

The prior art problem of optimally matching the impedance of an input/output port of a divider/combiner with the impedance at each of the amplifier modules is overcome in the present invention by varying in discrete steps a dielectric "channel" associated with each of the radial microstrip transmission lines and providing effectively paralleled impedance matching sections in the input/output port line. In the particular embodiment described above, this variation of the dielectric channel is accomplished by the particular shape of the face of the broad end of the base element 60. The dielectric medium is the air filling the space 110 between the annular planes (70, 75 and 80) and the radial microstrip line 105. The variation in the dielectric channel and the port line matching sections are appropriately selected to provide an optimal sequence of transmission line matching transformer impedance values.

In the divider mode, each segment of power is conducted from region 140 to the amplifier module 15 by a microstrip line 105. The dielectric medium lying adjacent the microstrip line 105 in space 110 may be thought of as a dielectric "channel" having a thickness that becomes progressively narrower as a function of the radial distance from rod 110. This progressive narrowing occurs in plural discrete steps, as described above, and serves to match the impedance of the power input port, in conjunction with the impedance matching sections in the input/output port line 125, with the impedance seen at the amplifier module 15.

In the combiner mode, each segment of amplified power is conducted from an amplifier module 15 to region 140 via a transmission line comprising a radial microstrip conductor 105 and the adjacent dielectric channel. The amplified power segment "sees" a dielectric channel that becomes progressively wider in plural discrete steps, as described above, thereby matching, in conjunction with the impedance matching sections in the input/output port line 125, the impedance at the amplifier module 15 with the impedance of the output port.

Although a preferred embodiment has been described in specific detail, the invention can be utilized in devices quite different from the one specifically described. For instance, the amplifiers need not be modular, and may be of a different type. The particular structure of the divider/combiner can be altered, and the dielectric channels can be varied in depth in a different manner and with different quantities of steps and, in some cases, with a dielectric other than air. These and other modifications are made possible by utilizing the inventive principles disclosed herein.

What is claimed is:

1. A power divider/combiner comprising:
  (a) a power input/output port having first and second ends and including one or more coaxial transmission line impedance transforming sections;
  (b) a microwave energy radial divider/combiner section comprising a plurality of microwave energy transmission lines connected to and symmetrically radiating from the second end of the power input/output port to the outer edge of the divider/combiner section, each microwave transmission line comprising a microstrip conductor extending from the second end of the the power input/output port to the outer edge of the divider/combiner section; and
  (c) means for transmitting microwave energy between the first end of the power input/output port and the ends of the transmission lines at the outer edge of the divider/combiner section, characterized in that the radial divider/combiner section includes an electrically conductive base surface, facing and fixably separated from the microstrip conductors, thereby forming a space between the microstrip conductors and the base surface, the space being filled with a dielectric medium, the distance of separation between the microstrip conductors and the base surface varying along the length of the transmission lines, such that an increasing impedance is attained from the outer edge to the second end of the power input/output port, and that the value of this increasing impedance, in conjunction with the value of the coaxial impedance transforming sections, is used to optimally match the impedance at the first end of the power input/output port with that at the ends of the transmission lines at the outer edge of the divider/combiner section.

2. The divider/combiner of claim 1 wherein the plural microwave energy transmission lines consist of twelve transmission lines.

3. The divider/combiner of claim 1 wherein the base surface comprises copper.

4. The divider/combiner of claim 1 wherein the dielectric medium is air.

5. The divider/combiner of claim 1 wherein the distance of separation between the microstrip conductors and the base surface varies in steps along the length of the transmission lines, the steps implementing impedance transforming section corresponding to that portion of an optimal transmission line impedance matching sequence of impedance values such that can be practically and efficiently realized through the use of microstrip transmission lines, each of the remaining values of the sequence being implemented by a corresponding coaxial impedance transforming section having an actual impedance value that is the quotient of its corresponding sequence impedance value divided by the number of microstrip transmission lines.

6. A divider/combiner comprising:
  (a) a radial divider/combiner section which comprises:
    (1) a base element of electrically conductive material, generally shaped like a disk, having a top surface and a bottom surface, the top surface facing the radial divider/combiner section and defined by a plurality of concentric circular annular planes, where each annular plane is parallel with every other annular plane,
    (2) a planar substrate fixably separated from the base element and lying parallel to the plurality of annular planes, and
    (3) a plurality of symmetrical radial microstrip lines deposited on the surface of the substrate that faces the radial divider/combiner section and the base element, and radiating from a common point at the center of the substrate surface to the outer edge of the substrate; and
  (b) a coaxial transmission line power input/output port including one or more coaxial transmission line impedance transforming sections, disposed at the center of the base element, each of the plurality of concentric circular annular planes being disposed at preselected distances from the plurality of radial microstrip lines so as to discretely vary the impedance thereof, the preselected distances being chosen so as to effectively implement impedance transforming sections corresponding to that portion of an optimal transmission line impedance matching sequence of impedance values such that can be practically and efficiently realized through the use of microstrip transmission lines, each of the remaining impedance values of the sequence being implemented by a corresponding coaxial impedance transforming section having an actual impedance that is the quotient value of its correspondence sequence impedance value divided by the number of radial microstrip transmission lines.

7. The divider/combiner of claim 6 wherein the base element surface is defined by three concentric circular annular planes.

8. The divider/combiner of claim 6 wherein the depth of each annular plane below the top surface ranges from about 0.006 to 0.1 inch.

9. The divider/combiner of claim 6 wherein the substrate comprises quartz.

10. The divider/combiner of claim 6 wherein the substrate has the shape of a circular disk and the microstrip lines extend onto the surface of the outer edge of the substrate.

11. The divider/combiner of claim 6 wherein
(a) the base has a circular hole therethrough located so that the center of the hole coincides with the center of the top surface of the base element, with a cylindrical tube, whose inner diameter is the same as the diameter of the hole in the base element, joined at one open end of the bottom surface of the base element so that the axis of the tube is aligned with the center of the hole in the base element; and
(b) an electrically conductive rod having a diameter smaller than that of the hole in the base element joined at one end to the common point at the center of the substrate surface and extending through the hole in the base element and through the center of the cylindrical tube to comprise a coaxial transmission line, with the axis of the rod coinciding with the axis of the tube, the center of the hole in the base element and the common point at the center of the substrate surface.

12. The divider/combiner of claim 11 wherein the electrically conductive rod comprises copper.

13. A modular power divider-amplifier-combiner comprising:
(a) a radial microwave energy divider comprising:
(1) a power input port having first and second ends and including one or more coaxial transmission line impedance transforming sections,
(2) a radial microwave energy divider comprising a plurality of microwave energy transmission lines connected to and symmetrically radiating from the second end of the power input port to the outer edge of the divider, each transmission line comprising a microstrip conductor extending from the second end of the power input port to the outer edge of the divider,
(3) means for transmitting microwave energy from the first end of the power input port through the coaxial impedance transforming sections to the divider;

(b) a plurality of amplifier modules, one for each transmission line, each amplifier associated with a different transmission line;
(c) means for conducting power from each transmission line to its associated amplifier module;
(d) a radial microwave energy combiner comprising:
(1) a power output port having second ends and including one or more coaxial transmission line impedance transforming sections,
(2) a radial microwave energy combiner comprising a plurality of microwave energy transmission lines connected to and symmetrically radiating from the second end of the power output port to the outer edge of the combiner section, each transmission line comprising a microstrip conductor extending from the second end of the power output port to the outer edge of the combiner,
(3) means for transmitting microwave energy from the combiner to the first end of the power output port through the coaxial impedance transforming sections; and
(e) means for conducting power from each amplifier module to its associated transmission line, characterized in that the divider and combiner each include an electrically conductive base surface, facing and fixably separated from the microstrip conductors, thereby forming a space between the microstrip conductors and the base surface, the space being filled with a dielectric medium, the distance of separation between the microstrip conductors and the base surface varying along the length of the transmission lines such that an increasing impedance is attained from the outer edge to the second ends of the power input and output ports, respectively, and that the value of these increasing impedances, in conjunction with the values of the respective coaxial impedance transforming sections, are used to optimally match the respective impedances at the first ends of the power input and output ports with that at the ends of their associated transmission lines at the outer edge of the divider and combiner sections, respectively.

14. The divider-amplifier-combiner of claim 13 wherein the plural microwave energy transmission lines of the divider and combiner each consist of twelve transmission lines and wherein the plural amplifier modules consist of twelve modules.

15. The divider-amplifier-combiner of claim 13 wherein the divider and combiner base surfaces each comprise copper.

16. The divider-amplifier-combiner of claim 13 wherein the dielectric medium of the divider and combiner is air.

17. The divider-amplifier-combiner of claim 13 wherein the plural amplifier modules each comprise two hybrid-combined field effect transistors.

18. The divider-amplifier-combiner of claim 13 wherein the distance of separation between the microstrip conductors and the base surface varies in steps along the length of the transmission lines, the steps implementing impedance transforming sections corresponding to that portion of an optimal transmission line impedance matching sequence of impedance values such that can be practically and efficiently realized through the use of microstrip transmission lines, each of the remaining sequence values being implemented by a respective corresponding coaxial impedance transforming section having an actual impedance value that is the quotient of its corresponding impedance sequence value divided by the number of microstrip transmission lines.

19. A divider-amplifier-combiner comprising:
(a) a microwave energy radial divider/combiner section which comprises:
  (1) a base element of electrically conductive material, shaped generally like a disk, having a top surface and a bottom surface, the top surface facing the radial divider/combiner section and defined by a plurality of concentric circular annular planes, where each annular plane is parallel with every other annular plane,
  (2) a planar substrate fixably separated from the base element and lying parallel to the plurality of annular planes, and
  (3) a plurality of symmetrical radial microstrip lines deposited on the surface of the substrate that faces the radial divider/combiner section and the base element, and radiating from a common point at the center of the substrate surface to the outer edge of the substrate; and
(b) a coaxial transmission line power input/output port including one or more coaxial transmission line impedance transforming sections, disposed at the center of the base element surface, each of the plurality of concentric circular annular planes being disposed at preselected distances from the plurality of radial microstrip lines so as to discretely vary the impedance thereof, the preselected distances being chosen so as to effectively implement impedance transforming sections corresponding to that portion of an optimal transmission line impedance matching sequence of impedance values such that can be practically and efficiently realized through the use of microstrip transmission lines, each of the remaining impedance values of the sequence being implemented by a corresponding coaxial impedance transforming section having an actual impedance value that is the quotient of its correspondence sequence impedance value divided by the number of radial microstrip transmission lines.

20. The divider-amplifier-combiner of claim 19 wherein the base element surface is defined by three concentric circular annular planes.

21. The divider-amplifier-combiner of claim 19 wherein the depth of each annular plane below the top surface ranges from about 0.006 to 0.1 inch.

22. The divider-amplifier-combiner of claim 19 wherein the substrate comprises quartz.

23. The divider-amplifier-combiner of claim 19 wherein the substrate has the shape of a circular disk and the microstrip lines extend onto the surface of the outer edge of the substrate.

24. The divider-amplifier-combiner of claim 19 wherein:
(a) the base has a circular hole therethrough located so that the center of the hole coincides with the center of the top surface of the base element, with a cylindrical tube, whose inner diameter is the same as the diameter of the hole in the base element, joined at one open end of the bottom surface of the base element so that the axis of the tube is aligned with the center of the hole in the base element;
(b) an electrically conductive rod having a diameter smaller than that of the hole in the base element joined at one end of the rod joined to the common point at the center of the substrate surface and extending through the hole in the base element and through the center of the cylindrical tube to comprise a coaxial transmission line, with the axis of the rod coinciding with the axis of the tube, the center of the hole in the base element and the common point at the center of the substrate surface.

25. The divider-amplifier-combiner of claim 24 wherein the electrically conductive rods comprise copper.

* * * * *